United States Patent
Tillotson

(10) Patent No.: US 10,620,257 B2
(45) Date of Patent: Apr. 14, 2020

(54) DETECTION SYSTEM FOR ABRADED WIRES IN FUEL TANKS

(71) Applicant: THE BOEING COMPANY, Chicago, IL (US)

(72) Inventor: Brian J. Tillotson, Kent, WA (US)

(73) Assignee: THE BOEING COMPANY, Chicago, IL (US)

( * ) Notice: Subject to any disclaimer, the term of this patent is extended or adjusted under 35 U.S.C. 154(b) by 234 days.

(21) Appl. No.: 15/612,491

(22) Filed: Jun. 2, 2017

(65) Prior Publication Data

US 2018/0348289 A1    Dec. 6, 2018

(51) Int. Cl.
| | |
|---|---|
| G01R 31/12 | (2020.01) |
| B64D 37/32 | (2006.01) |
| B64D 37/06 | (2006.01) |
| G01R 31/00 | (2006.01) |
| G01R 31/02 | (2006.01) |
| B64F 5/40 | (2017.01) |
| B64D 37/30 | (2006.01) |
| G01R 19/165 | (2006.01) |

(52) U.S. Cl.
CPC ......... *G01R 31/1272* (2013.01); *B64D 37/06* (2013.01); *B64D 37/32* (2013.01); *B64F 5/40* (2017.01); *G01R 31/008* (2013.01); *G01R 31/021* (2013.01); *B64D 37/30* (2013.01); *G01R 19/16571* (2013.01)

(58) Field of Classification Search
CPC .. G01R 31/1272; G01R 31/083; G01R 31/14; B64D 37/06; B64D 37/32; B64D 37/30
See application file for complete search history.

(56) References Cited

U.S. PATENT DOCUMENTS

| | | | | |
|---|---|---|---|---|
| 464,125 | A * | 12/1891 | Varley | G01R 31/021 |
| | | | | 324/544 |
| 2,491,668 | A * | 12/1949 | Koechling | G09B 9/18 |
| | | | | 434/54 |
| 6,225,811 | B1 * | 5/2001 | Bruning | G01R 31/021 |
| | | | | 324/541 |
| 6,278,381 | B1 * | 8/2001 | Bogert | G01F 23/0061 |
| | | | | 307/326 |
| 2001/0054902 | A1 | 12/2001 | Smith et al. | |
| 2002/0101695 | A1 * | 8/2002 | Saksa | H02H 3/006 |
| | | | | 361/64 |
| 2003/0105598 | A1 | 6/2003 | Orton | |
| 2007/0246608 | A1 * | 10/2007 | Tichborne | B64D 37/32 |
| | | | | 244/135 R |

FOREIGN PATENT DOCUMENTS

| | | | | |
|---|---|---|---|---|
| GB | 819711 | A * | 9/1959 | G01F 23/268 |

OTHER PUBLICATIONS

Extended European Search Report dated Nov. 12, 2018 in EP Application No. EP20180175376, 8 pgs.

* cited by examiner

*Primary Examiner* — Alessandro V Amari
*Assistant Examiner* — Kendrick X Liu
(74) *Attorney, Agent, or Firm* — Moore IP Law

(57) ABSTRACT

An abraded wire detection system ("AWDS") for detecting an abrasion on a wire in a fuel tank is disclosed. The AWDS includes an electrode on the fuel tank, a power source, and a current sensor in electrical series with the power source, wire, and the electrode. The current sensor includes circuitry that detects a current from the wire to the electrode. Additionally disclosed is an aircraft having a fuel tank, a wire within the fuel tank, and the AWDS.

20 Claims, 3 Drawing Sheets

DETECTION SYSTEM FOR ABRADED WIRES IN FUEL TANKS

BACKGROUND

1. Field

The present disclosure is related to the aircraft maintenance systems, and in particular, to systems for detecting latent faults on an aircraft.

2. Related Art

The advent of digital electronic technology in electrical and electronic systems has enabled unprecedented expansion of aircraft system functionality and evolution of aircraft function automation. As a result, systems incorporating such technology are utilized more and more to implement aircraft functions, including systems that affect the safe operation of the aircraft.

The electromagnetic environment includes energy which is the same type of energy (i.e., electrical energy) that is used by electrical and electronic equipment to process and transfer information. As such, this environment may represent a hindrance to the proper operation of systems that depend on such equipment causing latent faults within the systems of an aircraft.

Unfortunately, at present, a large cost in designing and building a commercial aircraft is providing redundant systems to deal with situations where a fault occurs when there is an undiscovered latent fault in the same system. In general, aircraft certification requires addressing latent faults and one specific latent fault that needs to be considered is possibly abraded wires in the fuel tank of an aircraft. More specifically, abraded insulation on wires in the fuel tank of the aircraft in combination with a lightning strike, static charge during fueling, or charge from another abraded wire could cause an electrical arc through the abraded location.

Known approaches to address this issue have included aircraft manufactures installing numerous extra wire mounting brackets to maintain separation between wires, and to mandate more frequent inspections inside the fuel tank of an aircraft. Some of the problems associated with these approaches includes, for example, the substantial added cost of installation and inspection of adding extra brackets that are placed in the aircraft to keep wires away from each other and from any other conductive materials. The extra weight of such brackets can add to the total weight of the aircraft. Moreover, the added costs, difficulty, and resulting downtime of inspecting these wires in the field which may include emptying the fuel tanks and sending people and/or inspection equipment physically into the fuel tanks to visually inspect the wires. As a result, the aircraft must be removed from service for the inspection, the labor cost of performing the inspection may be high, and the burden of safety and proper ergonomic techniques used during the physical inspection may be substantial.

As such, there is a need for a system and method that addresses these problems and detects the abraded insulation cheaply and reliably enough to, among other benefits, eliminate the need for the extra brackets and most of the physical inspections of the wires within the fuel tank of the aircraft.

SUMMARY

An abraded wire detection system ("AWDS") for detecting an abrasion on a wire in a fuel tank is disclosed. The AWDS includes an electrode on the fuel tank, a power source, and a current sensor in electrical series with the power source, wire, and the electrode. The current sensor includes circuitry that detects a current from the wire to the electrode. Additionally disclosed is an aircraft having a fuel tank, a wire within the fuel tank, and the AWDS.

In an example of operation, the AWDS operates as part of a method for detecting the abrasion on the wire. Specifically, the method includes filling the fuel tank with electrically conductive fuel that submerges the wire and applying a voltage signal on the wire with a power source. Furthermore, the method also includes receiving a current on the electrode in electrical series with a fuel tank wall and determining if an abrasion is present on the wire from the received current. In this example, the received current corresponds to the voltage signal.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Disclosed is an abraded wire detection system ("AWDS") for detecting an abrasion on an insulated wire in a fuel tank. The AWDS includes an electrode on the fuel tank, a power source, and a current sensor in electrical series with the power source, insulated wire, and the electrode. The current sensor includes circuitry that detects a current from the wire to the electrode. Additionally disclosed is an aircraft having a fuel tank, an insulated wire within the fuel tank, and the AWDS.

In an example of operation, the AWDS operates as part of a method for detecting the abrasion on the insulated wire. Specifically, the method includes filling the fuel tank with electrically conductive fuel that submerges the insulated wire and applying a voltage signal on the insulated wire with a power source. Furthermore, the method also includes receiving a current on the electrode in electrical series with a fuel tank wall and determining if an abrasion is present on the insulated wire from the received current. In this example, the received current corresponds to the voltage signal.

Figure 1:
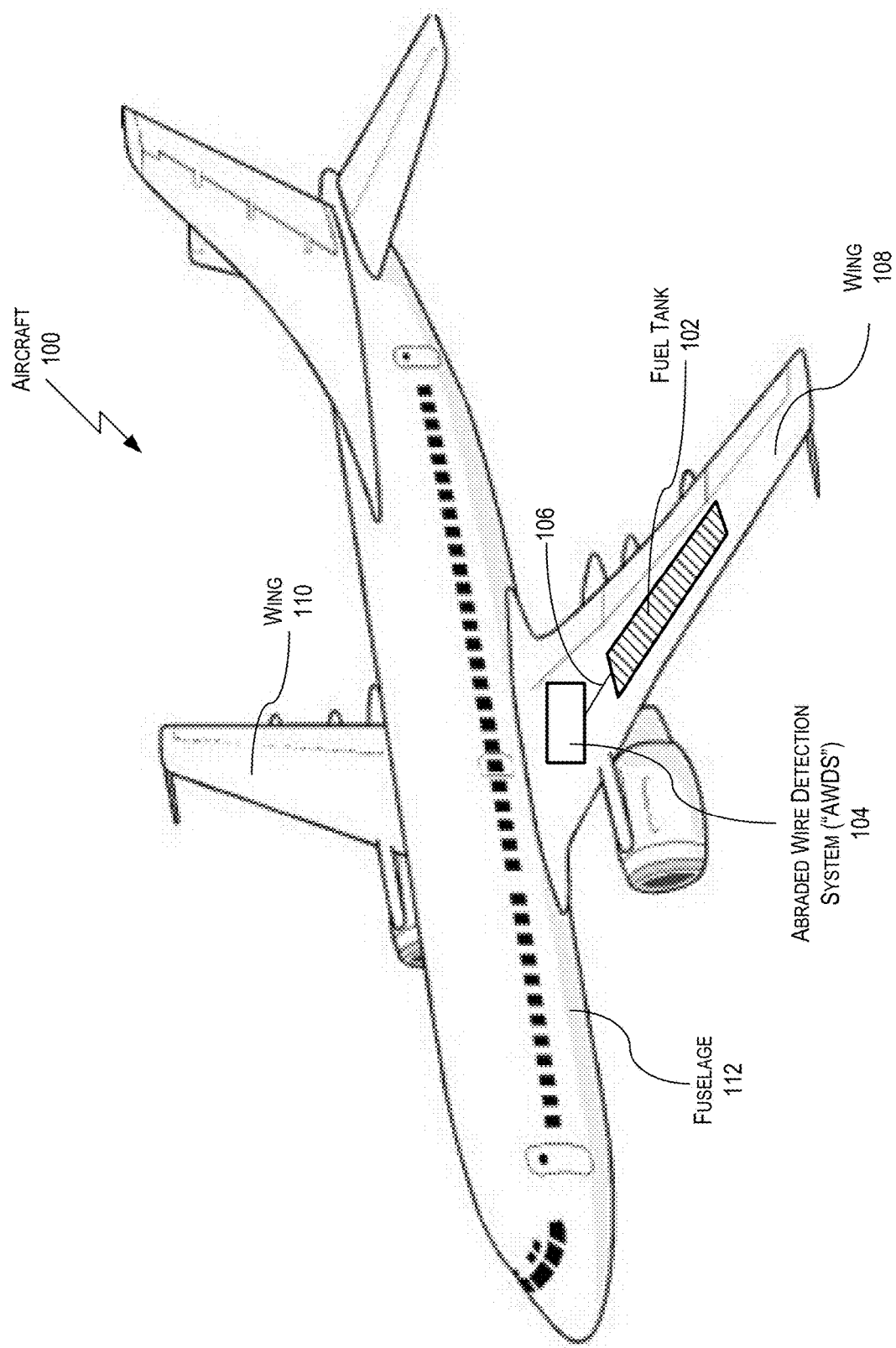
FIG. 1 is a system block diagram of an example of an implementation of an aircraft having a fuel tank and an abraded wire detection system ("AWDS") in accordance with the present disclosure.

More specifically, in FIG. 1, a system block diagram of an example of an implementation of an aircraft 100 having a fuel tank 102 and the AWDS 104 is shown in accordance with the present disclosure. The AWDS 104 is in electrically connected with the fuel tank 102 via an electrical connection path 106, where the electrical connection path 106 may include one or more wires or other type of conductors. In this example, both the fuel tank 102 and the AWDS 104 are shown as being part of a wing 108 of the aircraft 100; however, it is appreciated by those of ordinary skill in the art, that the fuel tank 102 and AWDS 104 may be part of either wing 108 or 110, both wings 108 and 110, and part of the fuselage 112 of the aircraft 100.

Figure 2:
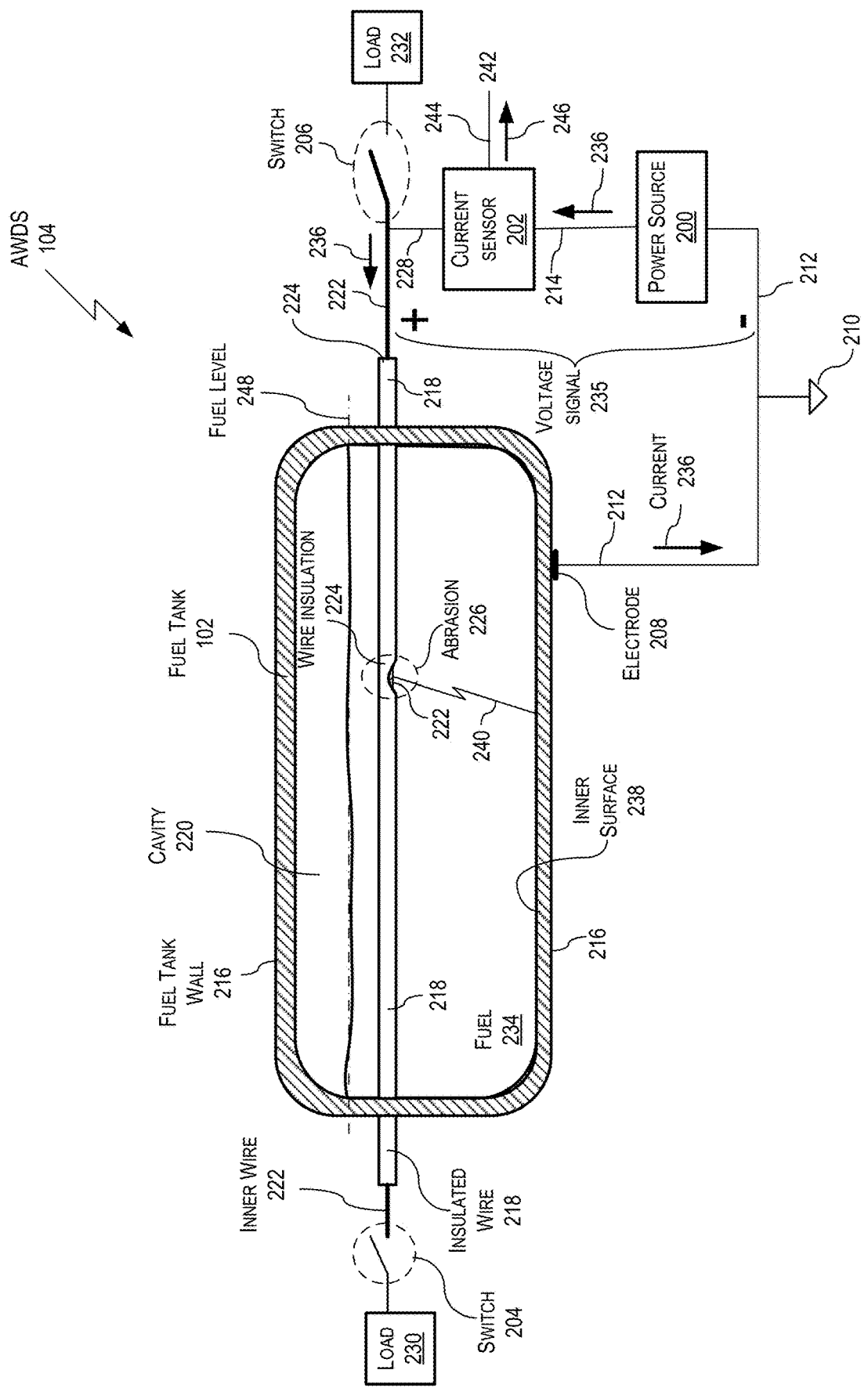
FIG. 2 is a system block diagram of an example of an implementation of the AWDS 104, shown in FIG. 1, in accordance with the present disclosure.

Turning to FIG. 2, a system block diagram of an example of an implementation of the AWDS 104 (shown in FIG. 1) is shown in accordance with the present disclosure. In this example, the AWDS 104 includes a power source 200, a current sensor 202, and at least switches 204 and 206. The power source 200 is in electrical series with an electrode 208 and ground 210 via signal path 212 and the current sensor 202 via signal path 214, respectively. The electrode 208 is in electrical series with a fuel tank wall 216. In this example, the fuel tank 102 is assumed to have conductive walls (i.e., fuel tank wall 216) that may be constructed from a metal or another conductive material. An insulated wire 218 is shown going through a cavity 220 (i.e., the inside) of the fuel tank 102. The insulated wire 218 includes at least one inner wire 222 encased in a wire insulation 224. In this example, the insulated wire 218 is shown to have an abrasion 226 within the cavity 220 of the fuel tank 102. The abrasion 226 has worn away part of the wire insulation 224 exposing part of the inner wire 222 to the cavity 220 of the fuel tank 102. The inner wire 222 is in electrical series with the first switch 204 and second switch 206; furthermore, the inner wire 222 is also in electrical series with the current sensor 202 via signal path 228. The insulated wire 218 is shown to be in electrical series (via the first switch 204 and second switch 206, respectively) with other electrical/electronic parts of the aircraft 100 that for simplicity of illustration are shown as a first load 230 and second load 232. In another example, it will be appreciated by those of ordinary skill in the art that the insulated wire 218 may enter the fuel tank 102 at only one point and connect to load 230 at some location inside tank 102 within cavity 220, for example, if the load 230 is a dielectric-coated electrode in a fuel quantity indication system. In such a case, the load 230 may have effectively infinite resistance, so switch 204 may be omitted. As such, in this example, the AWDS 104 includes at least one switch 206.

In this example, the fuel tank wall 216 is assumed to be conductive but it is appreciated that the fuel tank wall 216 may be also constructed out of non-conductive composite materials (i.e., the fuel tank 102 is non-conductive). In the case of a non-conductive fuel tank 102, the inner surface of the fuel tank 102 may include some conductive material (not shown) to allow for electrical conductivity with the electrode 208. As an example, the conductive materials may be conductive bands (such as, for example, metal bands) that run along the inside of the cavity 220 along in the inner surface of the fuel tank wall 216 similar to "tiger stripes." These bands may then be in electrical series with the electrode 208. These bands would also help dissipate any electric change accumulation in an electrically conductive fuel 234.

It is appreciated by those of ordinary skill in the art that the electrode 208 may be a part of the fuel tank wall 216 in the case of a conductive fuel tank 102 or part of the conductive materials in a non-conductive fuel tank 102.

It is appreciated by those of ordinary skill in the art that while only one insulated wire 218 is shown in this example for the purpose of ease of illustration, the fuel tank 102 have a plurality of insulated wires (not shown) running through the cavity 220 of the fuel tank 102. As such, it is appreciated that the AWDS 104 may be in electrical series with every individual insulated wire running through the cavity 220 or there may be a plurality of AWDS (not shown) in electrical series with the plurality of insulated wires.

In this example, the power source 200 may be a direct current ("DC"), such as, for example, a battery, or alternating current ("AC") power supply. The current sensor 202 is, or includes, a module, device, component, or circuit configured to measure current such as, for example, an ammeter (commonly known as an "amp meter"). The current sensor 202 may be a digital or analog device. As an example, the current sensor 202 may include a threshold detector that detects if a current between the insulated wire 218 and the electrode 208 is above a predetermined current level. In general, the current sensor 202 measures the current leaking from the power source 200 to insulated wire 218, through the electrically conductive fuel 234, and the fuel tank wall 216 to the electrode 208. When the current exceeds a predetermined threshold, the insulated wire 218 is identified as abraded.

It is appreciated by those of ordinary skill in the art that circuits, components, modules, and/or devices of, or associated with, the AWDS 104 are described as being in electrical series with each other. In this document, in electrical series represents connecting the circuits, components, modules, and/or devices of, or associated with, the AWDS 104 along a single electrical signal path such that the same current flows through all of the circuits, components, modules, and/or devices of, or associated with, the AWDS 104. In this example, the closed circuit of AWDS 104 (the signal path from ground 210 through the signal path 212, power source 200, signal path 214, current sensor 202, signal paths 228 and 222, insulated wire 218, abrasion 226, signal path 240 through the fuel 234, fuel tank wall 216, electrode 208, and signal path 212 back to ground 210) is a series circuit where the current 236 is passing through every point in the series circuit and has a constant magnitude value.

In an example of operation, the AWDS 104 operates as part of a method for detecting the abrasion 226 on the insulated wire 218. Specifically, the method includes filling the cavity 220 of the fuel tank 102 with the electrically conductive fuel 234 that submerges the insulated wire 218, applying a voltage signal 235 on the insulated wire 218 with the power source 200, and receiving a current 236 on the electrode 208 that is passed to the current sensor 202. The current sensor 202 measures the amount of current 236 that passes from the inner wire 222 at the abrasion 226 to the electrode 208 that is in electrical series with the fuel tank wall 216. This current 236 is caused by the exposure of the inner wire 222 to the electrically conductive fuel 234 that is in electrical series with the inner surface 238 via physical contact within the cavity 220. As a result, the inner wire 222 is in electrical series with the electrode 208 via a signal path 240 though the electrically conductive fuel 234.

In general, before applying the voltage signal 235, the aircraft 100 should be parked so that no acceleration forces (i.e., g-forces) or electrically conductive fuel 234 sloshing exposes the abrasion 226 to air or changes the capacitance of the insulated wire 218 during the measurement of current 236.

In this example, the power source 200 is configured to produce the voltage signal 235 that has a predetermined voltage value that is generally small and no greater than the operating voltage of the highest voltage insulated wire in cavity 220 of the fuel tank 102. As an example, the voltage signal 235 may be, for example, 28 volts or less, which generally produces an electric arc discharge in air of no more than approximately 20 microjoules of energy.

The electrically conductive fuel 234 is typically an anti-static fuel that is a fuel mixture of aircraft fuel with a conductivity improving additive. The conductivity improving additive is generally known as anti-static additives or static dissipater additives that increase the electrical conductivity of the aircraft fuel, such as, for example jet fuel. For example, jet fuel is a petroleum mixture of a large number of different hydrocarbons and typically has low conductivity in the order of approximately one (1) conductivity unit ("CU") to about 20 CU, where 1 CU is equal to 1 pico Siemens/meter (1 pS/M) that equal $1 \times 10^{-12}$ ohm$^{-1}$ meter$^{-1}$. For comparison purpose, deionized water has a conductivity of about 10 million CU. An example of the anti-static additive utilized in the electrically conductive fuel 234 may be STADIS® 450 produced by Innospec of Englewood, Colo. As a result, the electrically conductive fuel 234 reduces the chances of igniting the electrically conductive fuel 234 because its improved electrical conductive helps in dissipating any static charges that are accumulated either as a result of a lighting strike, static charge during fueling, or from the electrically conductive fuel 234 moving through pipes, hoses, values, or filters in the fuel system of the aircraft 100.

It is appreciated by those of ordinary skill in the art that in this example the bottom of the power source 200 and electrode 208 are set to a ground plane that is electrically connected with ground 210. As such, the voltage signal 235 produced by the power source 200 is a voltage potential that has a magnitude that is referenced to the ground plane, which is set to zero voltage by the ground 210. Therefore, in this example, the current sensor 202 measures the amount of current 236 pulled from the power source 200 when an abrasion 226 is present (within the electrically conductive fuel 234) that causes a circuit path to be closed around the power source where the combination of the insulated wire 224, open portion of the inner wire 222 at the abrasion, electrically conductive fuel 234, fuel tank wall 216, and electrode 208 act as an impedance load on the power source 200. This assumes that the current sensor 202 has very low impedance, which is usually the case.

If the current 236 is above a predetermined value, the current sensor 202, or an alert device 242 in signal communication with the current sensor 202 via signal path 244, may transmit an alert signal 246 that a fault exists on the insulated wire 224. As an example, the current sensor 202, or alert device 242, may include an analog gauge that may be visually inspected or a digital system that measures the output of the current sensor 202 and produces the alert signal 246. In this example, the fault indicates that the abrasion 226 is present on the insulated wire 224 because the amount of current 236 that is sensed by the current sensor 202 is above the predetermined value. The alert signal 246 may be an analog or digital signal. As an example, the predetermined value may be chosen to trigger the alert signal 246 when abrasion 226 includes a hole about one millimeter in diameter through the wire insulation 224 that is about one millimeter thick. The United States Department of Defense standard STAN 91-91 requires military jets to use enough anti-static additives to yield fuel with conductivity in the range 50 to 600 pS/m (50 to $600 \times 10^{-12}$ Siemens/meter). At the lower end of that conductivity range, with the applied voltage signal 235 equal to approximately 28 volts, the current 236 through the abrasion is about $1.4 \times 10^{-12}$ amps, so (in this example) the predetermined value is chosen to be approximately $1.4 \times 10^{-12}$ amps. This value is within measurement range of commercially available single-chip instrumentation amplifiers like the Intersil ISL28633.

In this example, the cavity 220 of the fuel tank 102 is filled with enough electrically conductive fuel 234 to submerge the insulated wire 218 because the insulated wire 218 is located below a fuel level 248 of the electrically conductive fuel 234.

It is appreciated by those of ordinary skill in the art that the first switch 204 and second switch 206 are utilized to isolate the insulated wire 218 from the rest of the aircraft (i.e., the first load 230 and second load 232) so as to limit circuit path of the AWDS 104 to a current path that includes power source 200, current sensor 202, insulated wire 218, abrasion 226, electrically conductive fuel 234, fuel tank wall 216, and electrode 208 back to the power source 200. The first switch 204 and second switch 206 may be manual or digital switches. Once the AWDS 104 has completed its test method, the first switch 204 and second switch 206 are set to a closed position so that the insulated wire 218 may continue to electrically connect the first load 230 to the second load 232 for normal aircraft 100 operations.

If the power source 200 is an AC power supply producing an AC voltage signal 235 having a predetermined high frequency, the first switch 204 and second switch 206 may be implemented as two choke coils that are configured to block the AC voltage signal 235. As an example, the predetermined frequency may be selected to minimize reactive currents that could complicate measurement of the leakage current 240. For example, the predetermined frequency may be chosen so that the inductive impedance (given by the product of $2\pi$, the predetermined frequency, and the inductance per unit length of the insulated wire 218) is equal and opposite to the capacitive impedance (given by the reciprocal of the product of $2\pi$, the predetermined frequency, and capacitance per unit length of the insulated wire 218). In this example, the inner wire 222 has a diameter of approximately one (1) millimeter and the wire insulation 224 has a dielectric constant that is approximately unity and the magnetic susceptibility is approximately unity. As such, the inductive impedance of the inner wire 222 is approximately equal and opposite to the capacitive impedance at frequencies near 5.4 megahertz. Typically, the inner wire 222 may have a diameter approximately equal to one millimeter or somewhat larger, and the wire insulation 224 may have a dielectric constant approximately equal to unity or somewhat larger, so the frequency range may be within a factor of 5 of 5.4 megahertz.

Utilizing this method, the AWDS 104 allows abraded wire faults to be classified as part of the "standard maintenance" procedure of the aircraft 100 instead of as a latent fault. This would allow the removal of weight and costly excess layers of protection in the fuel tank 102 by reducing the number of wire brackets in the cavity 220 of the fuel tank 102. The aircraft 100 may then be scheduled for standard maintenance. Moreover, the AWDS 104 may reduce the frequency or required rigor of inspections for abrased (e.g. abraded) wires in the cavity 220 of the fuel tank 102, which would result in the aircraft 100 being more often in service, reducing labor costs of the inspections, and other possible costs.

Figure 3:
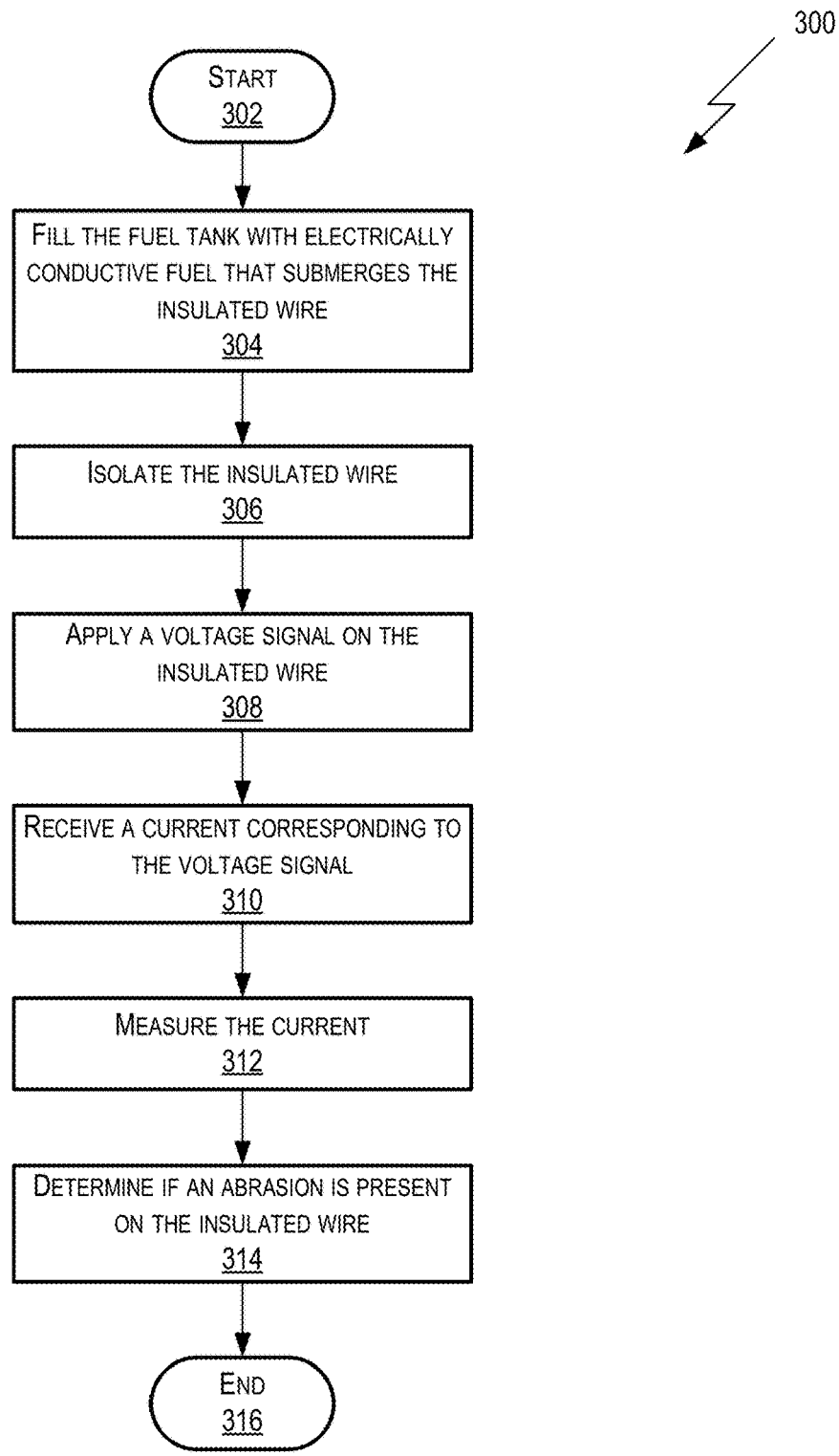
FIG. 3 is a flowchart of an example of an implementation of a method performed by the AWDS in accordance with the present invention.

In FIG. 3, a flowchart of an example of an implementation of a method 300 performed by the AWDS 104 is shown in accordance with the present invention. The method starts 302 and proceeds 304 by filling the cavity 220 of the fuel tank 102 with the electrically conductive fuel 234 that submerges some or all of the insulated wire 218 below the fuel level 248. The insulated wire 218 is then isolated 306 from the rest of the aircraft 100 by placing the first switch 204 and second switch 206 into the open position (causing an open circuit) and the voltage signal 235 is applied 308 to the insulated wire 218. The leakage current (i.e., current 236), corresponding to the applied voltage signal 235, is received 310 at the electrode 208 and the amount of current 236 is measured 312 by the current sensor 202. The current sensor 202, or the alert system 242, then determines 314 if an abrasion 226 is present on the insulated wire 218. This determination is based on includes determining if the received current 236 is above a predetermined current level. The method then ends 316.

It will be understood that various aspects or details of the invention may be changed without departing from the scope of the invention. It is not exhaustive and does not limit the claimed inventions to the precise form disclosed. Furthermore, the foregoing description is for the purpose of illustration only, and not for the purpose of limitation. Modifications and variations are possible in light of the above description or may be acquired from practicing the invention. The claims and their equivalents define the scope of the invention.

The flowchart and block diagrams in the different depicted example of implementations illustrate the architecture, functionality, and operation of some possible implementations of apparatuses and methods in an illustrative example. In this regard, each block in the flowchart or block diagrams may represent a module, a segment, a function, a portion of an operation or step, some combination thereof.

In some alternative examples of implementations, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different examples of implementations has been presented for purposes of illustration and description, and is not intended to be exhaustive or limited to the examples in the form disclosed. Many modifications and variations will be apparent to those of ordinary skill in the art. Further, different examples of implementations may provide different features as compared to other desirable examples. The example, or examples, selected are chosen and described in order to best explain the principles of the examples, the practical application, and to enable others of ordinary skill in the art to understand the disclosure for various examples with various modifications as are suited to the particular use contemplated.

What is claimed is:

1. An abraded wire detection system ("AWDS") (104) for detecting an abrasion (226) on a portion of an insulated wire (218) that is in a fuel tank (102), the AWDS (104) comprising:
   an electrode (208) in electrical series with an outer surface of a fuel tank wall (216) of the fuel tank (102);
   a power source (200);
   a current sensor (202), wherein the current sensor (202) includes circuitry that is configured to detect a current (236) from the insulated wire (218) to the electrode (208); and
   at least one switch (206) in electrical series with the insulated wire (218), wherein the at least one switch (206) is configured to disconnect the insulated wire (218) from a load.

2. The AWDS (104) of claim 1, wherein the fuel tank (102) includes an electrically conductive fuel (234).

3. The AWDS (104) of claim 1, wherein the fuel tank wall (216) is conductive.

4. The AWDS (104) of claim 1, wherein the current sensor (202) includes a threshold detector that is configured to detect whether the current (236) between the insulated wire (218) and the electrode (208) is above a predetermined current level.

5. The AWDS (104) of claim 1, wherein the at least one switch (206) is a choke coil.

6. The AWDS (104) of claim 1, wherein the power source (200) is an alternating current power source.

7. An aircraft (100) comprising:
   a fuel tank (102);
   an insulated wire (218), wherein a portion of the insulated wire (218) is within the fuel tank (102); and
   an abraded wire detection system ("AWDS") (104) for detecting an abrasion (226) on the portion of the insulated wire (218) in the fuel tank (102), the AWDS (104) including:
      an electrode (208) in electrical series with an outer surface of a fuel tank wall (216) of the fuel tank (102);
      a power source (200)
      a current sensor (202), wherein the current sensor (202) includes circuitry that is configured to detect a current (236) from the insulated wire (218) to the electrode (208); and
      at least one switch (206) in electrical series with the insulated wire (218), wherein the at least one switch (206) is configured to disconnect the insulated wire (218) from a load.

8. The aircraft (100) of claim 7, wherein the fuel tank (102) includes an electrically conductive fuel (234).

9. The aircraft (100) of claim 7, wherein the fuel tank wall (216) is conductive.

10. The aircraft (100) of claim 7, wherein the current sensor (202) includes a threshold detector that is configured to detect whether the current (236) between the insulated wire (218) and the electrode (208) is above a predetermined current level.

11. The aircraft (100) of claim 7, wherein the at least one switch (206) is a choke coil.

12. The aircraft (100) of claim 7, wherein the power source (200) is an alternating current power source (200).

13. A method (300) for detecting an abrasion (226) on a portion of an insulated wire (218) that is in a fuel tank (102) of an aircraft (100), the method (300) comprising:
   applying (308) a voltage signal (235) on the portion of the insulated wire (218) from a power source (200), the portion of the insulated wire (218) submerged in electrically conductive fuel (234);
   receiving (310) a current (236) on an electrode (208) in electrical series with a fuel tank wall (216) of the fuel tank (102), wherein the received current (236) corresponds to the voltage signal (235) applied to the insulated wire (218);
   determining (314), based on the received current (236), whether the abrasion (226) is present on the portion of the insulated wire (218) submerged in the electrically conductive fuel (234); and
   switching at least one switch (206) in electrical series with the insulated wire (218) into an open position, wherein the at least one switch (206) disconnects the insulated wire (218) from a load when the at least one switch (206) is in the open position.

14. The method (300) of claim 13, wherein the fuel tank (102) is non-conductive and includes conductive materials within the fuel tank (102) along an inner surface (238) of the fuel tank wall (216).

15. The method (300) of claim 14, wherein the conductive materials are metal bands.

16. The method (300) of claim 13, wherein the fuel tank (102) is conductive and the electrode (208) is in electrical series with the fuel tank wall (216).

17. The method (300) of claim 13, wherein determining (314) whether the abrasion is present includes determining whether the received current is above a predetermined current level.

18. The method (300) of claim 13, wherein the at least one switch (206) is a choke coil.

19. The method (300) of claim 13, wherein applying the voltage signal (235) includes applying an alternating current voltage signal (235).

20. The method (300) of claim 19, wherein the alternating current voltage signal (235) has a frequency such that inductive impedance of the insulated wire (218) is equal and opposite to capacitive impedance of the insulated wire (218).

\* \* \* \* \*